United States Patent [19]
Matsuoka

[11] Patent Number: 5,573,418
[45] Date of Patent: Nov. 12, 1996

[54] PRESS-IN CONNECTION TYPE STRUCTURE FOR ELECTRIC PART

[75] Inventor: Noriyuki Matsuoka, Yokohama, Japan

[73] Assignee: Yamaichi Electronics Co., Ltd., Tokyo, Japan

[21] Appl. No.: 362,856

[22] Filed: Dec. 23, 1994

[30] Foreign Application Priority Data

Dec. 28, 1993 [JP] Japan .................................. 5-354667

[51] Int. Cl.⁶ .................................................. H01R 13/62
[52] U.S. Cl. ...................... 437/331; 439/67; 439/73
[58] Field of Search ........................... 439/331, 73, 67, 439/334, 525, 526

[56] References Cited

U.S. PATENT DOCUMENTS

| | | | |
|---|---|---|---|
| 3,596,228 | 7/1971 | Reed et al. | 439/59 |
| 4,780,086 | 10/1988 | Jenner et al. | 439/42 |
| 5,171,154 | 12/1992 | Casciotti et al. | 439/67 |
| 5,389,820 | 2/1995 | Matsuoka | 439/70 |
| 5,468,157 | 11/1995 | Roebuck et al. | 439/73 |
| 5,493,150 | 2/1996 | Matsuoka | 257/668 |

FOREIGN PATENT DOCUMENTS 1349786  5/1971  United Kingdom .

*Primary Examiner*—Gary F. Paumen
*Assistant Examiner*—T. C. Patel
*Attorney, Agent, or Firm*—Wenderoth, Lind & Ponack

[57] ABSTRACT

In a press-in connection type structure for connecting an electric part having a plurality of contact elements with a connection medium having a plurality of contact elements under pressure, a press-in connection type structure for an electric part being characterized in that a coil spring is used as the pressing mechanism. The coil spring is disposed in a horizontal posture generally along a contacting area between the contact elements, a compressive force being applied along a pressure line on one side of the horizontal coil spring extending along an axis of the coil spring, so that a multi-point pressing force is generated, as a reaction thereof, at each contacting point between each turn of the coil spring along another pressure line on the other side of the coil spring and the connection medium (or electric part), thereby electrically connecting the contact elements under pressure.

10 Claims, 8 Drawing Sheets

PRESS-IN CONNECTION TYPE STRUCTURE FOR ELECTRIC PART

BACKGROUND OF THE INVENTION

1. [Field of the Invention]

This invention relates to a press-in connection type structure for an electric part, which is used for connecting, under pressure, a contact element of a given electric part such as an IC, to a contact element of a connection medium such as a wiring sheet or an IC socket, and more particularly to a press-in connection type structure which is suited to be used together with a connection medium composed of a wiring sheet having flexible properties.

2. [Brief Description of the Related Art]

Heretofore, for connecting, under pressure, a contact element of an IC to a contact element of a flexible wiring sheet, a rubber having resilient properties has ben used as a pressing means, and the rubber is arranged so as to press a contacting area between the contact elements.

The pressing means is adapted to obtain a uniform pressing force utilizing resilient properties which the rubber has, so that the rubber may be compliant with the flexure of the wiring sheet. However, the pressing means composed of a rubber material has the shortcomings in that when the rubber pressing means is repeatedly subjected to compression for a long period of time, it is permanently deformed thus preventing the application of an appropriate pressure contacting force. The above shortcomings become more manifest when the rubber pressing means proves itself as being thermally deteriorated in a test of an IC under a high temperature condition.

Also, in the case of a rubber, since the contacting portion is compressed by its surface load, the compressive force is unduly increased relative to the pressure contacting force and this creates one of the causes for increasing the operating force.

SUMMARY OF THE INVENTION

It is, therefore, an object of the present invention to provide a press-in connection type structure for an electric part, in which a reliable press-in connection can be realized.

To achieve the above object, according to one aspect of the present invention, there is essentially provided in a press-in connection type structure for connecting an electric part having a plurality of contact elements with a connection medium having a plurality of contact elements under pressure, a press-in connection type structure for an electric The press-in connection type structure is characterized in that a coil spring is used as the pressing means, the coil spring being disposed in a horizontal posture generally along a contacting area between the contact elements, a compressive force being applied along a pressure line on one side of the horizontal coil spring along an axis of the coil spring extending, so that a multi-point pressing force is generated, as a reaction thereof, at each contacting point between each turn of the coil spring along another pressure line on the other side thereof and the connection medium (or electric part), thereby electrically connecting the contact elements under pressure.

In another aspect of the present invention, there is also provided in a press-in connection type structure for an electric part in which leads of a wiring sheet having flexible properties are pressed against contact elements of an electric part by pressing means. The press-in connection type structure for an electric part is characterized in that a coil spring is used as the pressing means, the coil spring being disposed in a horizontal posture generally along a contacting area between the leads of the wiring sheet and the contact elements, a compressive force being applied along the pressure line on one side of the horizontal coil spring extending along an axis of the coil spring, so that a multi-point pressing force is generated, as a reaction thereof, at each contacting point between each turn of the coil spring along another pressure line on the other side thereof and the wiring sheet, thereby electrically connecting the leads with the contact elements under pressure.

According to the present invention, when the coil spring is arranged in its horizontal posture along the contacting area and the compressive force is applied along the pressure line on one side of the coil spring extending along the axis thereof, a uniform multi-point pressing force is generated, as a reaction thereof, at each contacting point between each turn along the other pressure line on the other side of the coil spring and the connection medium (or electric part) such as the wiring sheet, so that the contact elements are reliably contacted with each other under pressure.

Also, since any irregularities on the pressing surface can be favorably absorbed by a resilient force directed in a direction perpendicular to the axis of each turn of the coil spring, a uniform pressure is made available. Moreover, where the connection medium is a wiring sheet having flexing properties, an appropriate contacting pressure can be obtained between the contact elements because the contact elements are moved by the resilient force of each turn of the coil spring in such a manner as to comply with the flexure of the wiring sheet.

According to the present invention, the problem of permanent deformation caused by compression, thermal deterioration, etc. as in the case with a rubber can be eliminated as much as possible, and the above-mentioned functions can be favorably exhibited for a long period of time. Furthermore, each turn, which constitutes the coil spring, is compressed along a pressure line by point load, so that the compressive force is reduced and an operating force for the compression is reduced.

Various advantages and features which characterize the present invention are pointed out with particularity in the claims annexed hereto and form a part hereof. However, for a better understanding of the present invention, its advantages, and objects attained by its use, reference should be had to the drawings, which form a further part hereof, and to the accompanying descriptive matter, in which there are illustrated and described some preferred embodiments of the present invention.

DETAILED DESCRIPTION OF THE EMBODIMENT

Some embodiments of the present invention will be described with reference to FIGS. 1 through 11.

In the embodiments, a wiring sheet 6 having flexible properties is shown as a representative example of a connection medium, and an IC 4 is shown as a representative example of an electric part.

Figure 1:
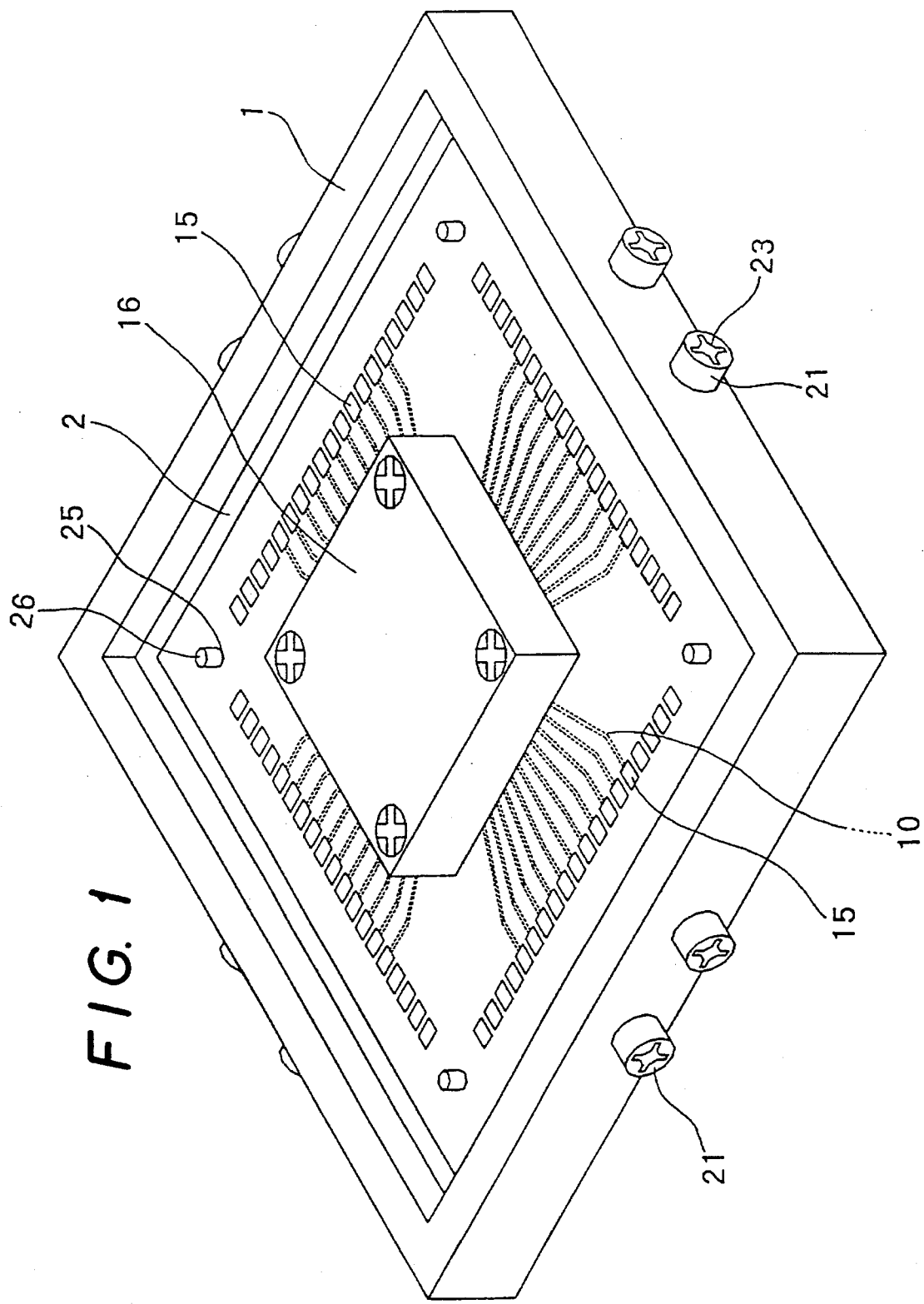
FIG. 1 is a perspective view of a press-in connection type device body for an electric part showing one embodiment of the present invention.
Figure 2:
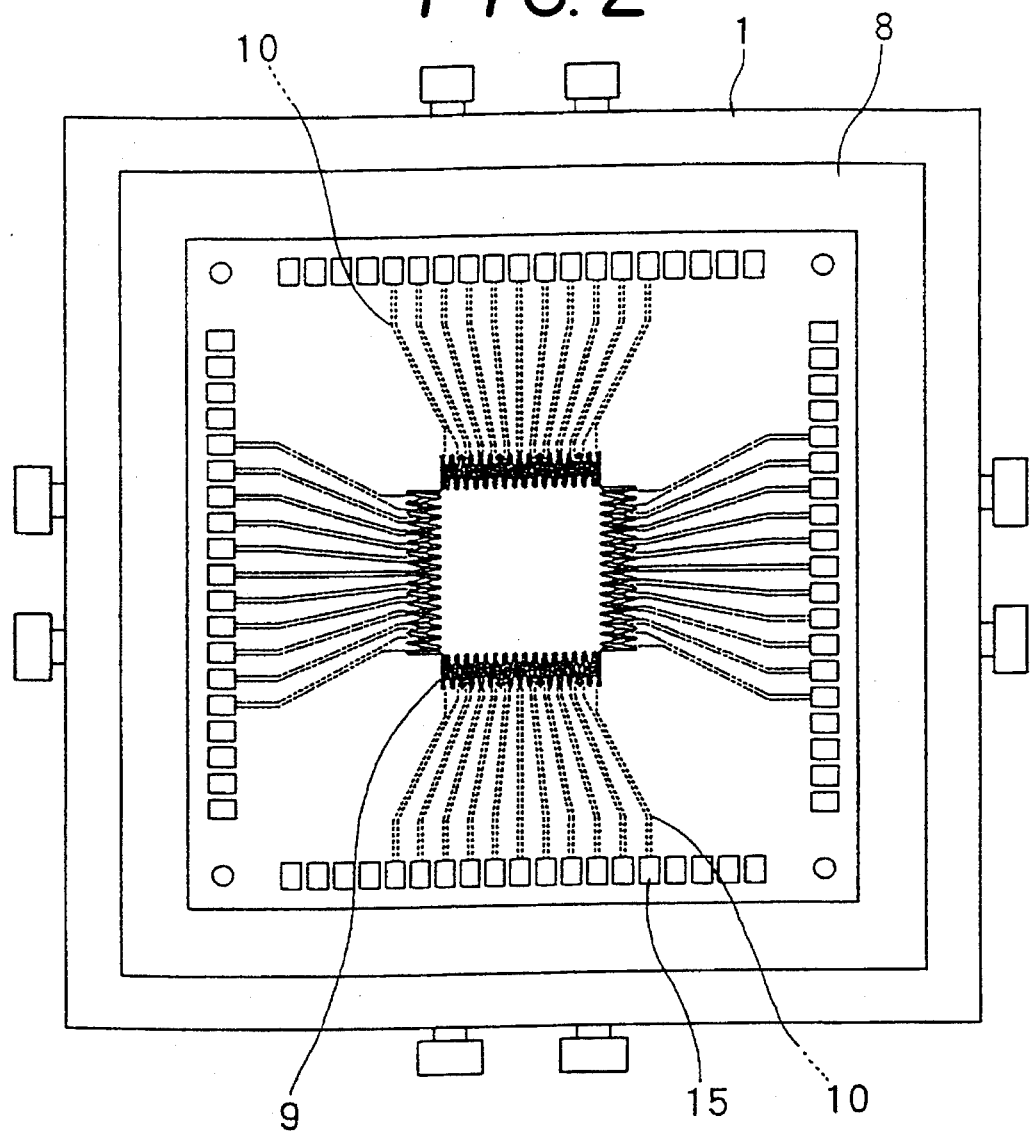
FIG. 2 is a plan view of the press-in connection type device body of FIG. 1, but with a pressing cover removed therefrom.
Figure 3:
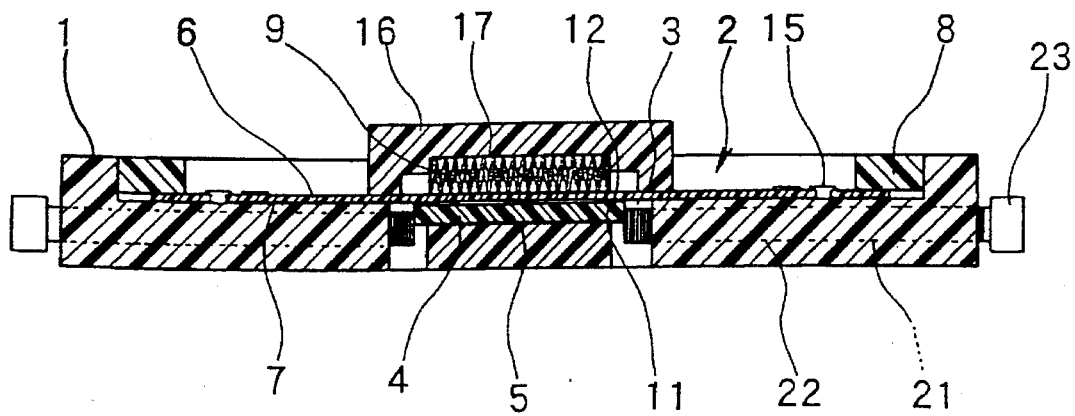
FIG. 3 is a cross-sectional view of the press-in connection type device body of FIG. 1.

As shown in FIGS. 1 through 3, as well as elsewhere, a substrate 1 formed of an insulative material is of a flat and square shape. The substrate 1 includes a square sheet receiving portion 2 which is opened to one surface thereof, and an IC receiving portion 3 formed at a central portion of the sheet receiving portion 2 and opened to an inner bottom surface of the sheet receiving portion 2. The IC 4 is received in the IC receiving portion 3 and supported on a support seat 5 which is formed at the inner bottom surface of the IC receiving portion 3. The wiring sheet 6 is received in the sheet receiving portion 2 and supported on a support portion 7 which forms the bottom surface of the sheet receiving portion.

The IC 4 supported on the support seat 5 is in contact with or adjacently opposite to the wiring sheet 6 supported on the support seat 7 at a central portion of the wiring sheet 6, and covered with the wiring sheet 6. Owing to this arrangement, the upper surface of the IC 4 received in the IC receiving portion 3 is generally flush or coplanar with that of the support seat 7.

The IC 4 and the wiring sheet 6, which are in superimposed relation, are assembled with the substrate 1 as one unit. As means for assembling them, for example, a frame 8, which has an outer dimension generally the same as that of the sheet receiving portion 2 as shown in FIG. 2, is prepared and this frame 8 is fitted into an inner peripheral edge of the sheet receiving portion 2, with corner portions of the frame 8 secured to the substrate 1 by suitable means such as screws. By securing the wiring sheet 6 to the support seat 7 of the substrate 1, the IC 4 is retained between the wiring sheet 6 and the support seat 5 of the substrate 1.

Figure 11:
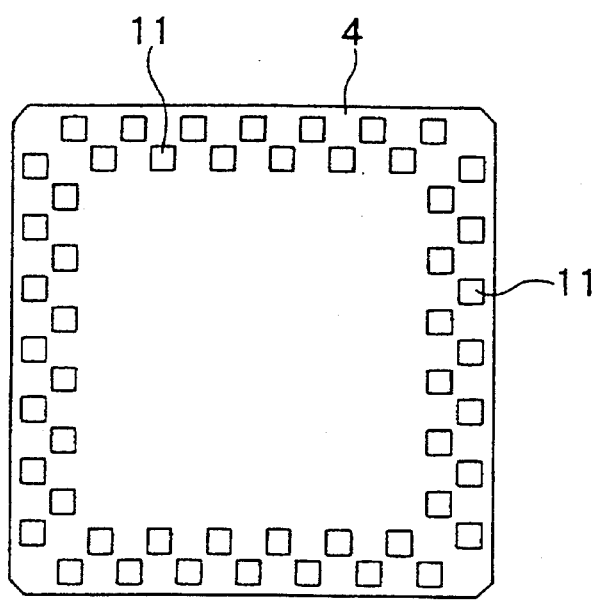
FIG. 11 is a plan view of an IC as an electric part.

As shown in FIG. 11, the IC 4 is square in outer configuration and has a number of contact elements 11. First contact elements of the wiring sheet 6, which will be described hereinafter, are superimposed on the contact elements 11 for achieving electrical connection with leads 10.

The wiring sheet 6 is formed of a flexible insulating material such as, for example, synthetic resin film, and has a lead pattern corresponding to the contact elements 11 of the IC 4 thereon. The wiring sheet 6 may be formed of a wiring board having a comparatively high rigidity.

Leads 10, which constitute the lead pattern, are intimately attached to the wiring sheet 6, for example, by printing, adhesive, or anchoring and allowed to extend radially toward a peripheral edge portion of the wiring sheet 6 from a central portion (superimposing area with the IC 4) thereof, respectively have first contact elements 12, which are arranged at such narrow pitches as to be held opposite respectively to the contact elements 11 which are formed on the upper surface of the IC 4, at their inner ends which terminate at the superimposed area. Also, the leads 10 respectively have second contact elements 15, which are arranged at such wide pitches as to be held opposite to the contacts provided on a socket body, at their outer ends which terminate at the peripheral edge portion of the wiring sheet 6.

That is, the lead pattern is subjected to electrical connection with the contacts, at the second contact elements 15 which are formed on outer ends thereof and widely spread over an outer area of the IC 4. For example, the second contact elements 15 are arranged in array along an inner peripheral surface of the frame 8.

The lead pattern is, as shown in FIGS. 1 through 3, formed on the inner upper surface side of the wiring sheet 6 which is superimposed on the IC 4 or on the outer upper surface side thereof.

The IC 4 is received in the IC receiving portion 3 such that the IC 4 is allowed to move slightly in the horizontal direction within the IC receiving portion 3. In other words, the IC 4 is received in the IC receiving portion 3 such that the IC 4 is allowed to move in the horizontal direction, sliding on the lower surface of the wiring sheet 6 which covers the IC 4.

The IC 4 is received in a protective case or received directly in the IC receiving portion 3 and movable in the horizontal direction, with the IC 4 sandwiched between the substrate 1 and the wiring sheet 6.

The substrate 1 is provided with a fine adjustment pusher adapted to adjust the position of the IC relative to the wiring sheet 6 by pushing, within the IC receiving portion 3, a side surface of the IC 4 or a side surface of the case containing the IC 4.

As a concrete example of the fine adjustment pusher, as shown in FIGS. 1 through 3 as well as elsewhere, fine adjustment pins represented by externally threaded pins 21 are reciprocally movably mounted on the substrate 1. Each of the externally threaded pins 21 extends from a side surface of the substrate 1 toward an inner surface thereof through a through-hole 22 having an internally threaded portion. That is, the externally threaded pin 21 is inserted into the through-holes 22 allowing a distal end portion of the pin 21 to be projected into the IC receiving portion 3 so as to face the side surface of the IC 4 or the side surface of the protective case, with a head portion 23 of the external thread pin 21 allowed to project outwardly from the outer surface of the substrate 1. The positioning Pin 21 is reciprocally moved by a driver inserted into a minus or plus groove formed at the head portion 23. As the externally threaded pin 21 moves forwardly, it pushes the side surface of the IC 4 or the side surface of the protective case, so that the IC 4 is moved slightly in the horizontal direction.

The fine adjustment pins as represented by the externally threaded pins 21 are arranged in such a manner as to be capable of pushing a plurality of side surfaces or corner portions of the IC 4 or protective case. For example, the externally threaded pins 21 are radially arranged in such a manner as to be capable of pushing the four side surfaces of the IC 4 or protective case. By reciprocally moving the individual externally threaded pins 21, the IC 4 or protective case can be moved omni-directionally and horizontally. With this feature, the installation position of the IC 4 can be finely adjusted, so that the IC contact elements 11 and the first contact elements 12 will correctly face each other.

As shown in FIG. 1, the wiring sheet 6 is provided at peripheral edge portions (for example, a plurality of corner portions) thereof with positioning holes 25, and at a plurality of corner portions of the support seat 7 with positioning posts 26. By inserting the positioning posts 26 into the positioning holes 25, the wiring sheet 6 is supported on the support seat 7 at a predetermined location.

By assembling the substrate 1, the IC 4 and the wiring sheet 6 in the manner as mentioned above, the IC 4 is concealed between and favorably protected by the substrate 1 and the wiring sheet 6 so as to be subjected to transportation and storage. Also, by loading the above assembly directly in the socket, the second contact elements 15 exposed to the outer surface of the wiring sheet 6 are pressed against the contacts of the socket for electrical connection, so as to be subjected to an aging test.

The present invention has a pressing means for urging the superimposed area of the wiring sheet 6 so as to press the first contact elements 12 against the IC contact elements 11.

Figure 4A:
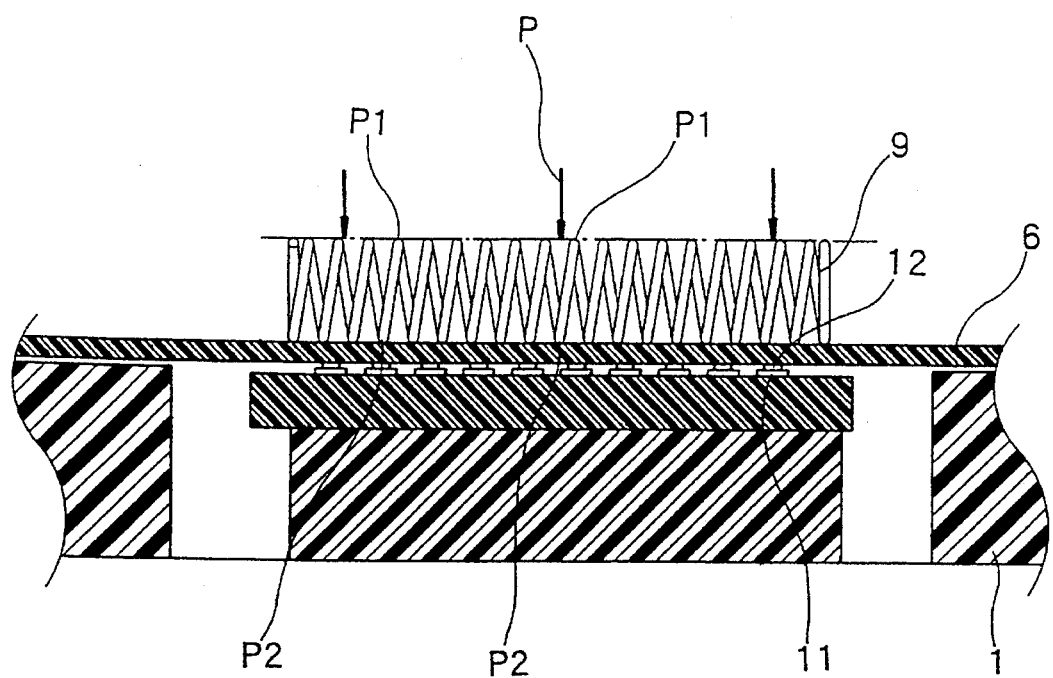
FIG. 4(A) is a cross-sectional view of the press-in connection type device body of FIG. 1, showing a coil spring, which is not yet compressed in the device body when viewed sideways.

A coil spring 9 is used as the pressing means. The coil spring 9 is, as shown in FIGS. 3 through 10, arranged in a horizontal posture generally along the contacting area between the contact elements 11 and 12, so that a compressive force P is, as shown in FIG. 4, applied along a pressure line (shown by a phantom line in FIG. 4(A)) on one side of the coil spring 9 extending along the axis of the horizontal coil spring 9. The coil spring 9 is disposed in its horizontal posture at a location immediately above the contacting area for the contact elements 11 and 12 or at an area proximate to the contacting area.

The compressive force P is applied to a pressure receiving point P1 of each turn on the bus bar on one side of the coil spring 9, and as a reaction thereof, a multi-point pressing force is generated at a pressing point P2 as each contacting point between each turn on a bus bar on the other side of the coil spring 9 and the wiring sheet 6 as the connection medium, so that the contact elements 11 and 12 are contacted with each other under pressure.

Since each turn of the coil spring 9 can be freely flexed, the pressing point P2 on each turn is moved upwardly and downwardly in a limited range, almost freely and without restriction from the other pressing point P2, so as to apply a pressure to the upper surface of the wiring sheet 6.

That is, when the coil spring 9 is arranged in its horizontal posture along the contacting area and the pressure P is applied to the pressure receiving point P1 on the bus bar on one side of the coil spring 9 along the axis thereof, a uniform multi-point pressing force is generated, as a reaction thereof, at a pressing point P2 as each contacting point between each turn on a bus bar on the other side of the coil spring 9 and the wiring sheet 6, so that the contact elements 11 and 12 are reliably contacted with each other under pressure.

Also, since any irregularities on the pressing surface can be favorably absorbed by a resilient force directed in a direction perpendicular to the axis of the coil spring, a uniform pressure is made available. Moreover, in case the connection medium is a wiring sheet 6 having flexing properties, an appropriate contacting pressure can be obtained between the contact elements because the contact elements are moved by the resilient force of each turn of the coil spring in such a manner as to comply with the flexure of the wiring sheet.

Although the coil spring 9 is arranged in such a manner as to be capable of pressing the upper surface of the wiring sheet 6 as the connection medium in the above embodiment, it may be arranged such that a pressing force is applied to the upper surface of the electric part such as the IC 4 by the coil spring 9, so that a contacting pressure with the connection medium can be obtained.

The compressive force P is applied to the coil spring 9 by a tool attached to a distal end of a robot arm or by an exclusive-use pressing cover 16 as will be described later.

FIGS. 1 and 3 depict the pressing cover 16 which is adapted to apply the compressive force P to the coil spring 9 being pressed against the upper surface of the wiring sheet 6. The coil spring 9 is retained in an inner area of the pressing cover 16 in such a manner as to be integral with the pressing cover 16.

For example, as shown in FIG. 3, a spring retaining groove 17 for retaining the coil spring 9 in the horizontal posture by receiving its upper half portion along the axis, is formed in an inner surface of the pressing cover 16. The lower half portion of the coil spring 9 is allowed to project from the spring retaining groove 17 in order to press the upper surface of the wiring sheet 6.

Figure 4B:
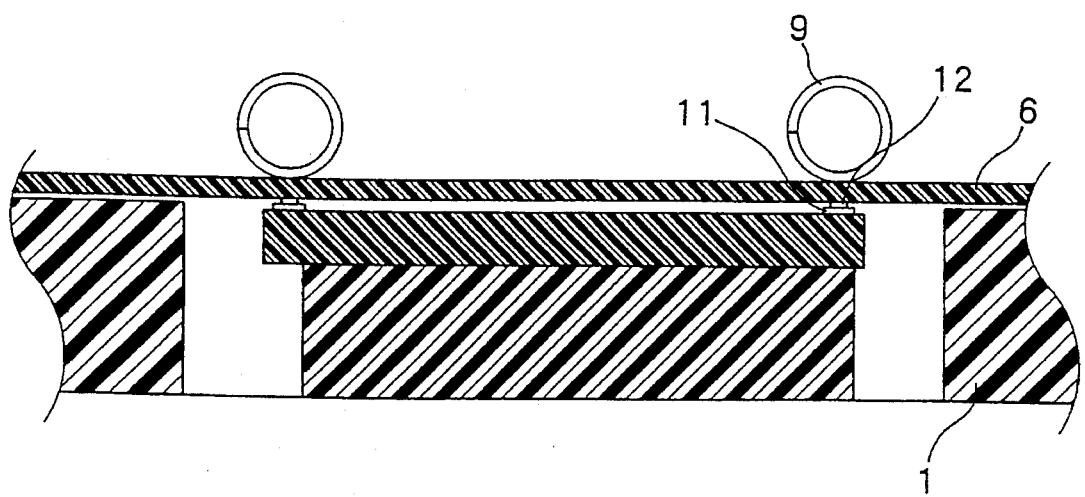
FIG. 4(B) is a cross-sectional view thereof, but when viewed from the front.
Figure 5A:
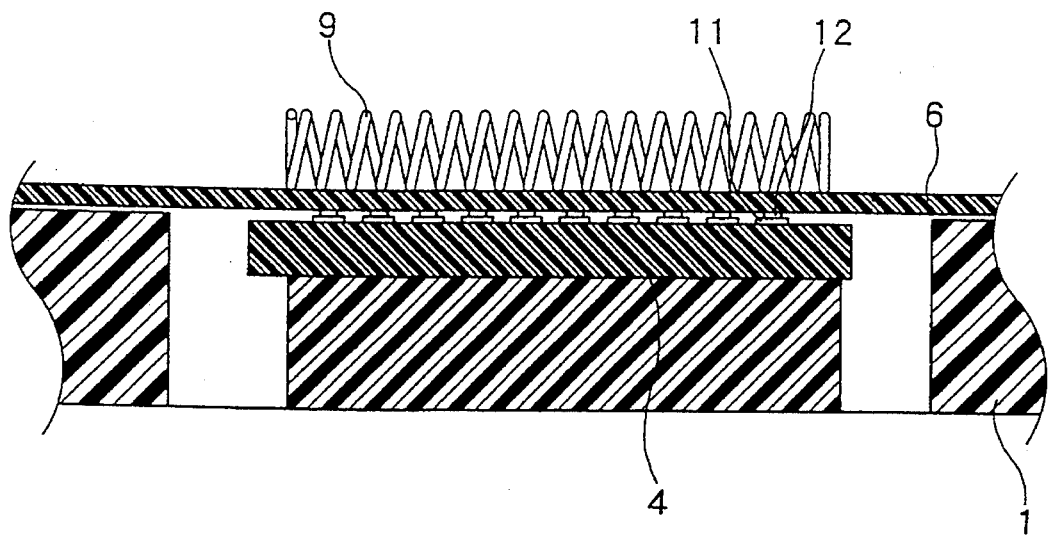
FIG. 5(A) is a cross-sectional view of the press-in connection type device body of FIG. 1, showing the coil spring, which is already compressed in the device body, when viewed sideways.
Figure 5B:
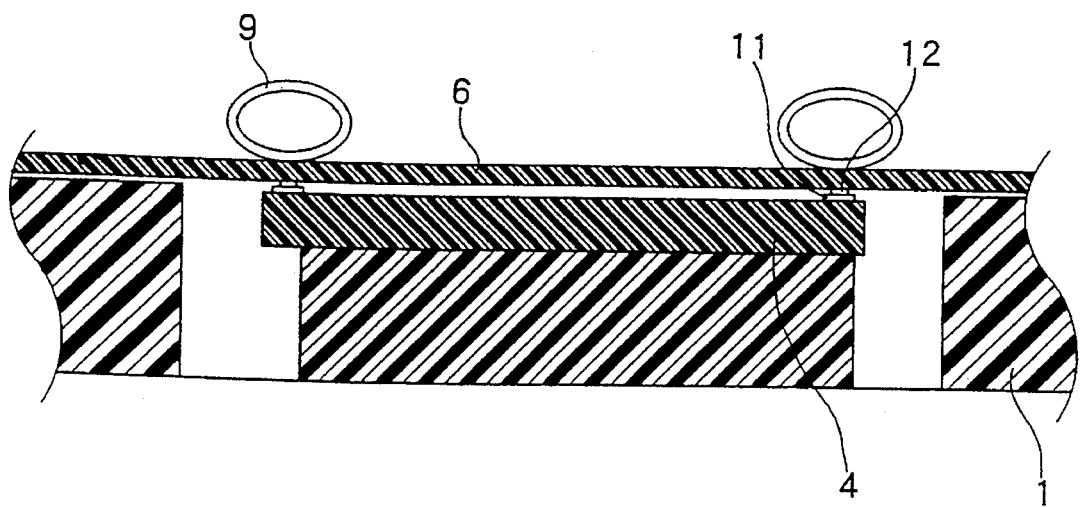
FIG. 5(B) is a cross-sectional view thereof, but when viewed from the front.
Figure 6:
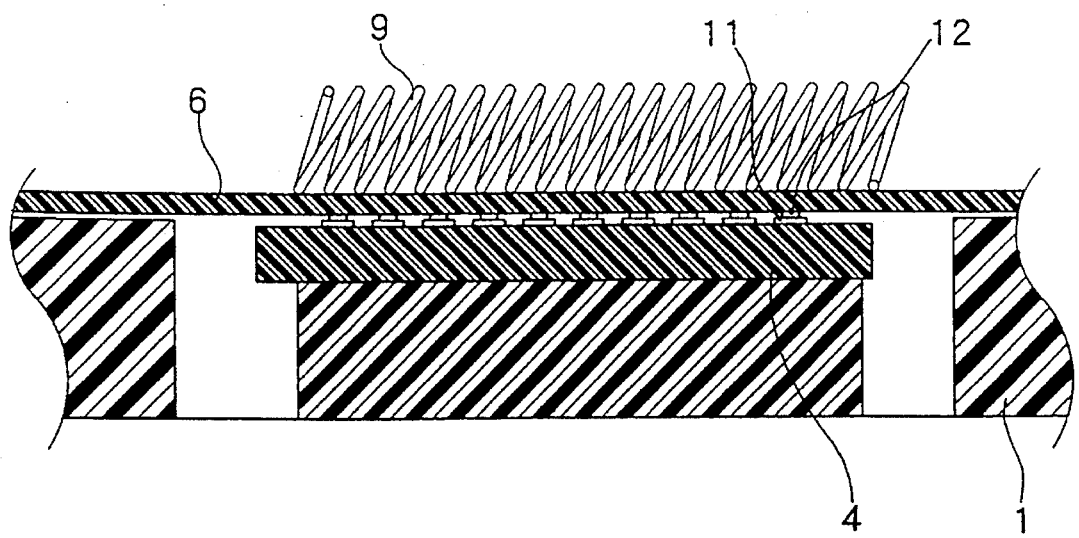
FIGS. 6(A) and (B) show another embodiment, FIG. 6(A) being a cross-sectional view of a press-in connection type device body, showing a coil spring, which is not yet compressed in the above connection type device body, when viewed sideways, and FIG. 6(B) being a cross-sectional view thereof, but when viewed from the front.
Figure 6:
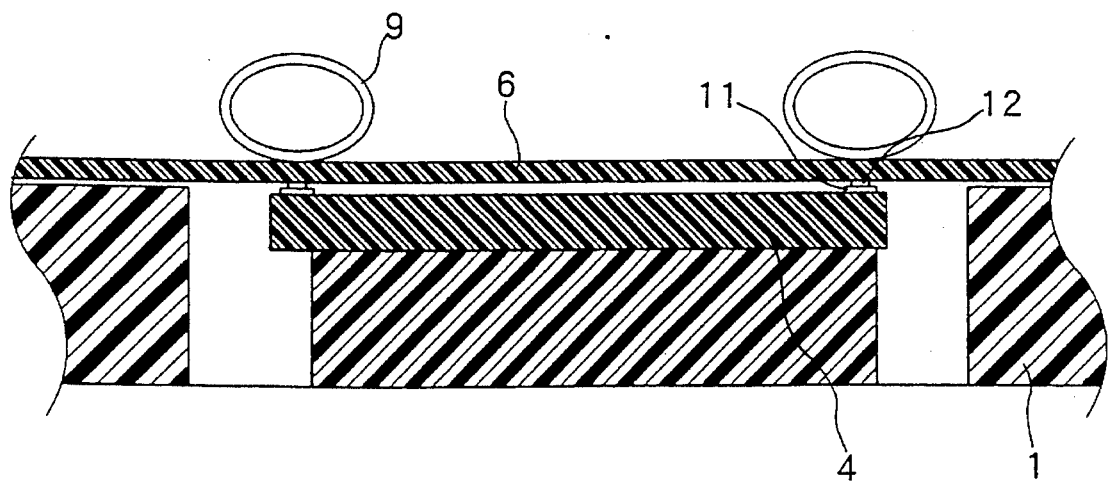

In an example of FIGS. 4(A), 4(B), 5(A) and 5(B), a cylindrical coil spring having a regular circular outer configuration is used as the coil spring 9, so that a generally perpendicular pressing force is generated at the pressing point P2 with respect to the upper surface of the wiring sheet 6 as the connection medium. FIGS. 4(A) and 4(B) show the coil spring 9 which is not yet compressed, whereas FIGS. 5(A) and 5(B) show the coil spring 9 which is already compressed.

In a case where the IC contact elements 11 are arranged in staggered relation as shown in FIG. 11, a uniform pressing force can be applied to the group of contact elements 11 which are arranged in staggered relation, by placing a single coil spring 9 in its horizontal posture in the contacting area such as, for example, on the center line).

Figure 7A:
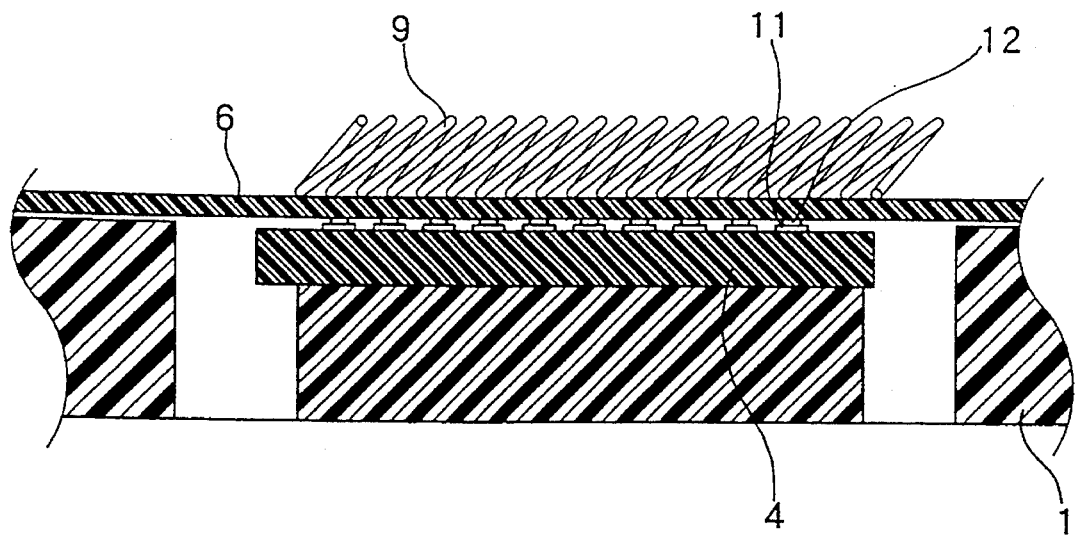
FIG. 7(A) is a cross-sectional view of the press-in connection type device body of FIGS. 6(A) and 6(B), showing a coil spring, which is already compressed, when viewed sideways.
Figure 7B:
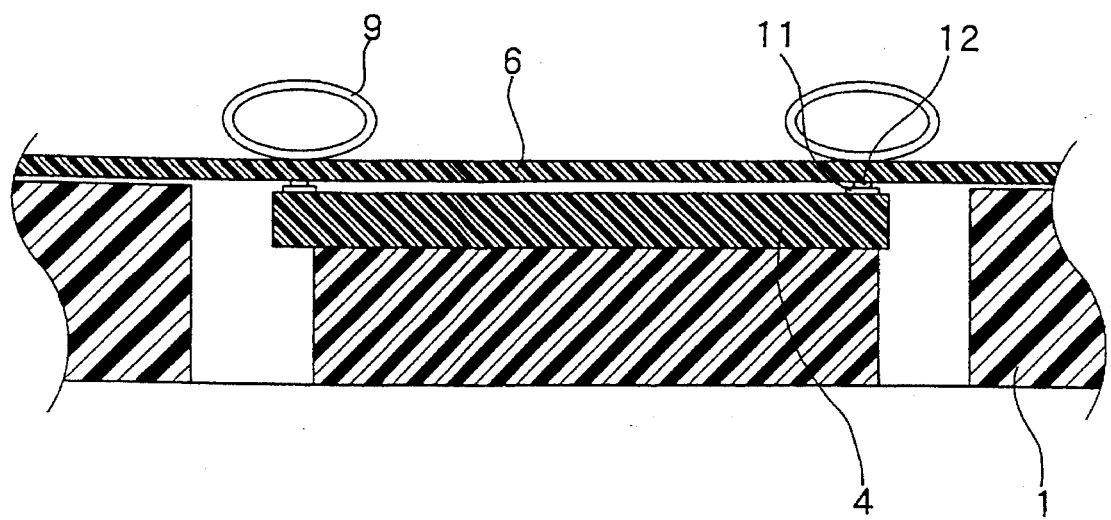
FIG. 7(B) is a cross-sectional view thereof, but when viewed from the front.

In an example shown in FIGS. 6(A), 6(B), 7(A) and 7(B), an angularly wound coil spring (canted coil spring) 9 is used as the above-mentioned coil spring 9, so that a generally perpendicular pressing force is generated at the pressing point P2 with respect to the upper surface of the wiring sheet 6 as the connection medium. FIGS. 6(A) and 6(B) show the coil spring 9 which is not yet compressed, whereas FIGS. 7(A) and 7(B) show the coil spring 9 which is already compressed.

Figure 8:
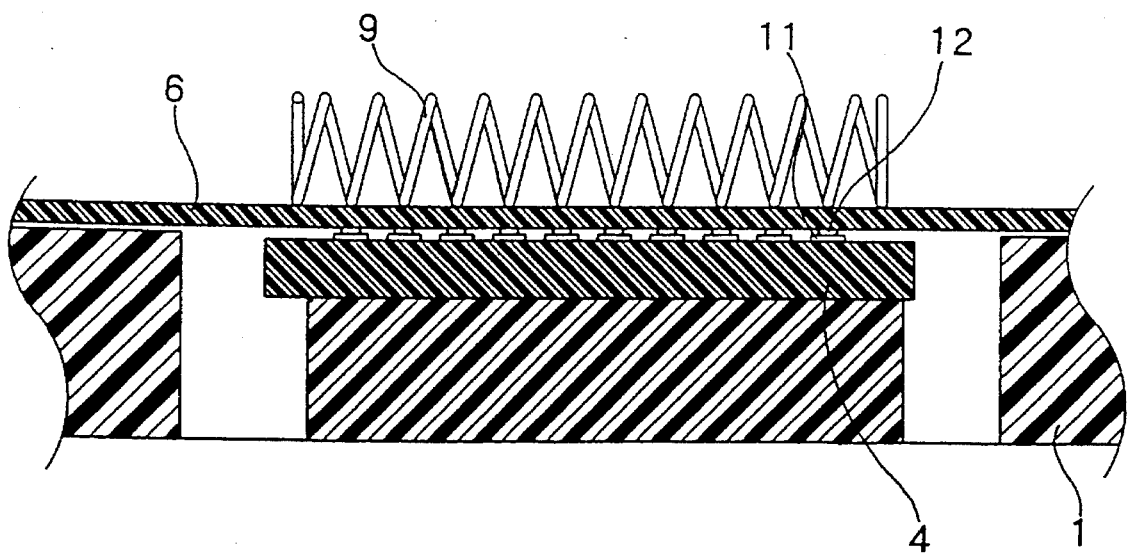
FIG. 8 is a cross-sectional view of a press-in connection type device body showing a further embodiment of the present invention.

In an example of FIG. 8, a coil spring 9 having pressing points P2 arranged at the same pitches as the contact elements 11 and 12 is used as the above-mentioned coil spring 9, so that positions corresponding to the contact elements 11 and 12 can be pressed.

Figure 9:
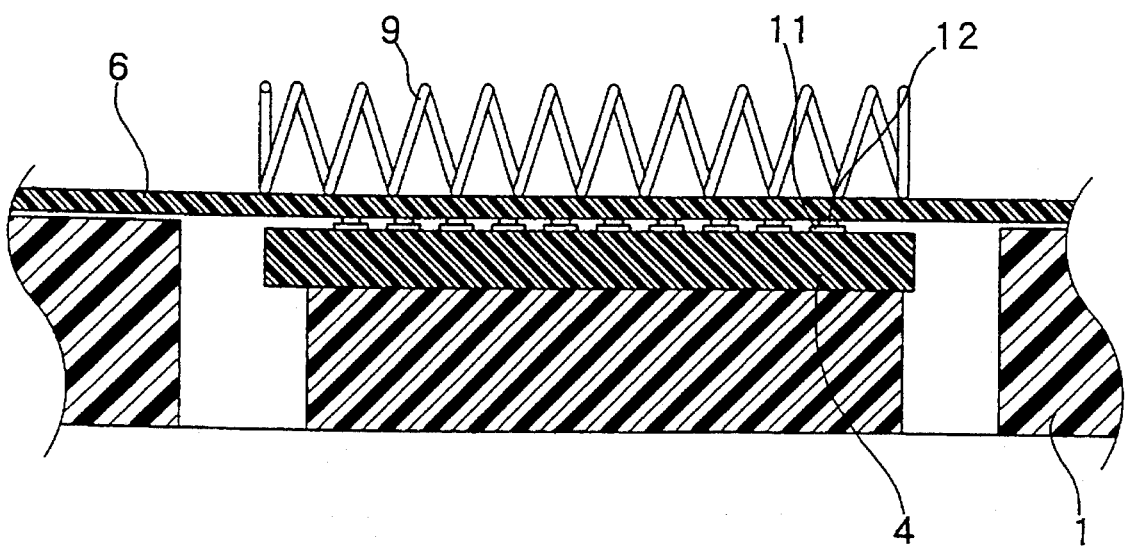
FIG. 9 is a cross-sectional view of a press-in connection type device body showing a still further embodiment of the present invention.

In an example of FIG. 9, a coil spring 9 having turns which are arranged at larger pitches than those of the contact elements 11 and 12 is used as the above-mentioned coil spring 9. The turns constituting the coil spring 9 of this example are arranged at equal pitches.

Figure 10:
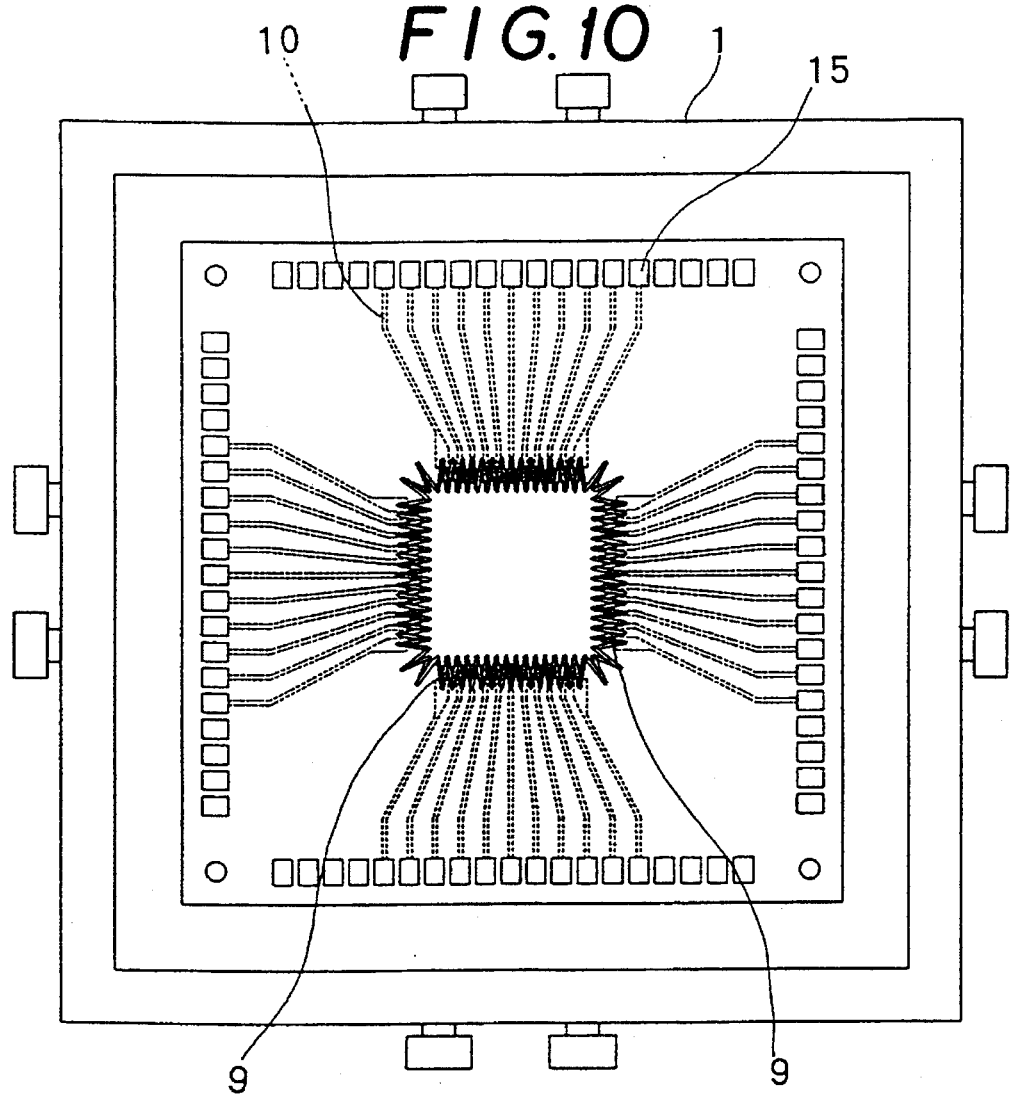
FIG. 10 is a plan view of a press-in connection type device body according to a yet further embodiment of the present invention.

In an example of FIG. 10, two coil springs 9 connected together are used, one coil spring 9 being arranged to press one contacting area while the other coil spring 9 being arranged to press another contacting area. That is, in a case where the contact elements 11 are arranged along all four sides of the IC 4 as the electric part, the wiring sheet 6 as the connection medium has contact elements 12 corresponding to the contact elements 11. In this example, since the contacting area is formed at each of the four sides, the coil springs 9 are arranged at each contacting area and connected to each other.

According to the present invention, the wiring sheet 6 may be replaced by an IC socket. In other words, the present invention includes a case where the above-mentioned coil spring 9 is used as means for bringing the contact elements 11 of the IC 4 into pressure contact with the contacts (contact elements) of the IC socket. In this case, the coil spring 9 is operated to press the IC 4 directly or to press a carrier retaining the IC 4 therein, so that a pressure contacting force can be obtained with respect to the contact elements 11 and 12.

According to the present invention, when the coil spring is arranged in its horizontal posture along the contacting area and a compressive force is applied to a bus bar on one side of the coil spring extending along the axis thereof, a uniform multi-point pressing force is generated, as a reaction thereof, at each contacting point between each turn along a pressure line on the other side of the coil spring (i.e. through points P2 in FIG. 4(A)) and the connection medium (or electric part), so that the contact elements are reliably contacted with each other by a uniform pressing force.

Also, any irregularities on the pressing surface with respect to the electric part or connection medium can be favorably absorbed by a resilient force pressing the coil spring along the pressure line, so that a uniform pressure is made available. Moreover, in case the connection medium is a wiring sheet having flexing properties, an appropriate contacting pressure can be obtained between the contact elements because the contact elements are moved by the resilient force of each turn of the coil spring in such a manner as to comply with the flexure of the wiring sheet.

According to the present invention, the problem of permanent deformation caused by compression, thermal deterioration, etc. as in the case with a rubber can be eliminated as much as possible, and the above-mentioned functions can be favorably exhibited for a long period of time. Furthermore, since each turn, which constitutes the coil spring, is compressed along the pressure line by point load, the compressive force can be reduced and an operating force for the compression can be reduced.

While there has been described what is at present considered to be the preferred embodiments of the invention, it will be understood that various modifications may be made thereto, and it is intended that the appended claims cover all such modifications which fall within the true spirit and scope of the invention.

What is claimed is:

1. A connection apparatus comprising:
    a substrate formed of an electrically insulating material, said substrate having a sheet-receiving portion with a sheet-receiving seat facing in a first direction, and an IC receiving portion disposed at a central portion of said sheet-receiving portion for receiving an IC having IC contact elements, said IC receiving portion having an opening which opens through said sheet-receiving seat in said first direction;

an IC supporting seat disposed in said IC receiving portion, facing in said first direction and offset from said sheet-receiving seat in a second direction opposite said first direction;

a flexible wiring sheet supported on said sheet-receiving seat, said wiring sheet having at least two rows of first contact elements disposed at a central portion thereof corresponding in position to said IC receiving portion and on a side of said wiring sheet facing in said second direction, said wiring sheet further having at least two rows of second contact elements disposed generally radially outwardly of said at least two rows of first contact elements, respectively, said first contact elements being arranged at a smaller pitch than said second contact elements;

a pressing device disposed on a side of said wiring sheet facing in said first direction; and wherein said pressing device comprises a pressing cover and at least two coil springs operably secured to said pressing cover for resiliently pressing said central portion of said wiring sheet in said second direction to cause said first contact elements of said wiring sheet to be pressed into contact with the IC contact elements of the IC when the IC is supported on said IC supporting seat, said coil springs being disposed with their central axes parallel to said wiring sheet and extending along said rows of said first contact elements, respectively.

2. A connection apparatus as recited in claim 1, wherein
    said pressing cover has at least two spring-retaining grooves formed in a surface thereof facing in said second direction; and said at least two coil springs are mounted in said at least two spring-retaining grooves, respectively.

3. A connection apparatus as recited in claim 1, wherein
    said wiring sheet is fixed to said sheet-receiving seat so as to close said opening of said IC receiving portion; and the IC is retained in said IC receiving portion between said wiring sheet and said sheet-receiving seat.

4. A connection apparatus as recited in claim 1, wherein
    said at least two rows of first contacts comprises four rows of first contacts;

said at least two rows of second contacts comprises four rows of second contacts disposed generally radially outwardly from said rows of first contacts, respectively; and said at least two coil springs comprises four coil springs having their central axes extending along said rows of said first contacts, respectively.

5. A connection apparatus as recited in claim 1, wherein
    said IC receiving portion is substantially square in shape;

said at least two rows of first contacts comprise four rows of first contacts disposed along four sides of said IC receiving portion of said substrate; and said at least two coil springs comprise four coil springs having their central axes extending along said rows of said first contacts, respectively.

6. A connection apparatus as recited in claim 1, wherein
    said first contact elements of each of said rows of said first contact elements are arranged at a given pitch; and each of said coil springs has a plurality of turns arranged at a pitch substantially the same as the given pitch of said first contact elements.

7. A connection apparatus as recited in claim 1, wherein each of said coil springs comprises a canted coil spring.

8. A connection apparatus as recited in claim 1, wherein said substrate is substantially flat and square in shape;

said sheet-receiving portion is substantially square in shape; and said IC receiving portion is substantially square in shape.

9. A connection apparatus as recited in claim 8, wherein said pressing cover has at least two spring-retaining grooves formed in a surface thereof facing in said second direction; and said at least two coil springs are mounted in said at least two spring-retaining grooves, respectively.

10. A connection apparatus as recited in claim 9, wherein said wiring sheet is fixed to said sheet-receiving seat so as to close said opening of said IC receiving portion; and the IC is retained in said IC receiving portion between said wiring sheet and said sheet-receiving seat.

* * * * *